United States Patent
Iwata et al.

(10) Patent No.: US 6,745,016 B2
(45) Date of Patent: Jun. 1, 2004

(54) AUTOMATIC GAIN CONTROL METHOD AND DEVICE

(75) Inventors: Yasushi Iwata, Yokohama (JP); Yasufumi Ichikawa, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/357,744

(22) Filed: Feb. 4, 2003

(65) Prior Publication Data

US 2003/0143968 A1 Jul. 31, 2003

Related U.S. Application Data

(62) Division of application No. 09/479,303, filed on Jan. 6, 2000.

(30) Foreign Application Priority Data

Jan. 8, 1999 (JP) ................................. 11-3070

(51) Int. Cl.[7] .......................... H04B 1/06; H04B 7/00; H04G 3/20
(52) U.S. Cl. ............................... 455/234.1; 455/240.1; 455/242.1; 455/245.1; 455/126; 330/278; 330/136; 330/129
(58) Field of Search ........................ 455/232.1–250.1, 455/126, 127, 68, 69, 522; 330/129, 136, 149, 278–281, 285, 296; 375/345

(56) References Cited

U.S. PATENT DOCUMENTS

| | | | |
|---|---|---|---|
| 4,210,874 A | 7/1980 | Moskowitz | 330/134 |
| 4,591,800 A | 5/1986 | Opas | 330/86 |
| 5,768,694 A | 6/1998 | Kumagai | 455/126 |
| 6,577,852 B1 * | 6/2003 | Iwata et al. | 455/240.1 |
| 6,597,898 B1 * | 7/2003 | Iwata et al. | 455/240.1 |

FOREIGN PATENT DOCUMENTS

| | | | | |
|---|---|---|---|---|
| EP | 0 654 899 | | 5/1995 | |
| JP | 3-7411 | * | 1/1991 | H03G/3/30 |
| JP | 6-45995 | * | 2/1994 | H04B/7/26 |
| JP | 8-32384 | * | 2/1996 | H03G/3/30 |
| JP | 9-83276 | | 3/1997 | |
| WO | WO 95/01676 | | 1/1995 | H04B/1/16 |

* cited by examiner

Primary Examiner—Duc M. Nguyen
(74) Attorney, Agent, or Firm—Pearne & Gordon LLP

(57) ABSTRACT

A constant output signal can be achieved by controlling a gain variable amplifier 2 based on a level of an output signal which is derived by variably amplifying a receiving signal S1 (input signal). An AGC output signal S11 is detected by a detector circuit 3. Then, a CPU 5 generates a control signal S8 based on a detected voltage signal S7. An RSSI detector portion 9 detects an RSSI signal S10 corresponding to a transmitting signal level from the receiving signal S1. The transmitting signal level is compared to a preceding transmitting signal level. The control signal from a preceding execution of the gain control is output if the present control signal is lower than the preceding control signal and the present transmitting signal level is reduced below the preceding transmitting signal level.

2 Claims, 5 Drawing Sheets

AUTOMATIC GAIN CONTROL METHOD AND DEVICE

BACKGROUND OF THE INVENTION

The present invention relates to automatic gain control (referred suitably to as "AGC" hereinafter) which is able to stabilize an input signal whose level is varied in a mobile communication device, etc. via gain control using a closed loop and then output it and, more particularly, an automatic gain control method and a device for embodying the same, which is able to execute the automatic gain control based on a transmission signal level (received signal strength indicator (RSSI) signal, etc.) detected from the input signal when a signal-to-noise (S/N) ratio of the input signal is degraded, and a radio communication device with such automatic gain control function.

In the prior art, in various signal processing devices, e.g., in the radio communication device, the automatic gain control (AGC) which stabilizes variation in a signal level of the received signal caused due to variation in a received electric field strength on a radio wave propagation path such as a radio line, etc. to reduce demodulation error, etc. is applied. As such automatic gain control, there are known the open loop control device in which a gain of a variable amplifier, etc. at the succeeding stage is controlled by an automatic gain control signal generated by detecting variation in the level of the input signal, and the close loop control device in which the gain of the variable amplifier, etc. at the preceding stage is controlled by the automatic gain control signal generated by detecting variation in the level of the input signal.

Under such automatic gain control, if the S/N of the input signal is degraded and thus a level of the input signal is reduced below a level of the noise signal, it becomes impossible to detect the variation in the level of the input signal. That is, it becomes impossible to generate an automatic gain control signal based on the input signal, so that the gain control of the variable amplifier at the preceding stage in the close loop control device cannot be carried out in answer to the variation of the input signal. In other words, if the device is employed under the noisy surroundings like the case the mobile telephone, the radio paging device (pager), or the like, for example, is employed with the movement under the surroundings with the extremely high noise level (surroundings in which there are much ignition noises of the vehicle, much radiation noises of electronic devices, etc.), or if the input signal level (received electric field strength) is low, the proper automatic gain control for the input signal cannot be achieved. In this case, there are such problems that good receiving characteristics cannot be assured and thus the received signal cannot be derived at a desired level.

As the digital AGC device, an example set forth in Patent Application Publication (KOKAI) Hei 9-83276 entitled "AGC Amplifier Control Circuit" is well known. In this example set forth in Patent Application Publication (KOKAI) Hei 9-83276, a gain obtained when the previous introduction of the input signal has been completed can be maintained at the time of starting the introduction of the input signal, so that this maintained gain is set in an AGC amplifier as an initial value and also the introduction error can be controlled by using a digital AGC loop. Accordingly, it is possible to delete the primary introduction of the input signal in an analogue format and thus to achieve high speed amplitude introduction control.

In the above-mentioned prior art, there is the problem that, when an S/N of the input signal is degraded and thus a level of the input signal is reduced below a level of the noise signal, reduction in a control voltage of a gain variable amplifier is caused and therefore proper automatic gain control cannot be achieved. That is, there is such a drawback that good receiving characteristics of the device cannot be achieved.

SUMMARY OF THE INVENTION

The present invention has been made to overcome such subject in the prior art, and it is an object of the present invention to provide an excellent automatic gain control method and a device for embodying the same, which is able to execute always proper automatic gain control and also achieve good receiving characteristics by preventing reduction in a control voltage of a gain variable amplifying means when an S/N of the input signal is degraded, and a radio communication device with such automatic gain control function.

In order to attain the above object, the automatic gain control method according to the first aspect of the present invention which achieves a constant output signal by controlling a gain variable amplifying means according to a control signal which is generated based on a level of an output signal which is derived by variably amplifying an input signal, comprises the steps of a output signal detecting step of detecting said output signal amplified by the gain variable amplifying means; a control signal generating step of generating the control signal for the gain variable amplifying means based on a detected output signal; a gain control state storing step of storing a gain control state every time when gain control of the gain variable amplifying means is executed; a input signal level detecting step of detecting a signal level from the input signal; a comparing step of comparing the input signal level with a control state set value which is defined previously; and a step of controlling a gain of the gain variable amplifying means by said control signal correspondence to the control state stored at preceding execution of the gain control when the signal level is reduced below the control state set value.

Preferably, the automatic gain control method according to the first aspect of the present invention which achieves a constant output signal by controlling a gain variable amplifying means according to a control signal which is generated based on a level of an output signal which is derived by variably amplifying an input signal, is characterized by comprising the steps of a detecting step of detecting an amplified output signal; a control signal generating step of generating the control signal for the gain variable amplifying means based on a detected voltage signal obtained by detection; a control signal storing step of storing the control signal every time when gain control of the gain variable amplifying means is executed; a signal level detecting step of detecting a transmitting signal level containing noises from the input signal; a comparing step of comparing the transmitting signal level with a threshold value which is defined previously; and a control signal outputting step of outputting the control signal stored at preceding execution of the gain control to the gain variable amplifying means when the transmitting signal level is reduced below the threshold value.

Also, the automatic gain control method according to the first aspect of the present invention which achieves a constant output signal by controlling a gain variable amplifying means according to a control signal which is generated based on a level of an output signal which is derived by variably amplifying an input signal, is characterized by comprising the steps of a detecting step of detecting an amplified output signal; a control signal generating step of generating the control signal for the gain variable amplifying means based on a detected voltage signal obtained by detection; a control signal holding step of holding the control signal; a signal level detecting step of detecting a transmitting signal level containing noises from the input signal; a signal level holding step of holding the transmitting signal level; a comparing step of comparing the transmitting signal level held at present execution of the gain control with the transmitting signal level held at preceding execution of the gain control; and a control signal outputting step of outputting the control signal held at preceding execution of the gain control to the gain variable amplifying means when the present control signal for a gain variable amplifier is lower in level than the preceding control signal for the gain variable amplifier and also the present transmitting signal level is reduced below the preceding transmitting signal level.

Also, the automatic gain control method according to the first aspect of the present invention which achieves a constant output signal by controlling a gain variable amplifying means according to a control signal which is generated based on a level of an output signal which is derived by variably amplifying an input signal, is characterized by comprising the steps of a detecting step of detecting an amplified output signal; a control signal generating step of generating the control signal for the gain variable amplifying means based on a detected voltage signal obtained by detection; a detected voltage signal holding step of holding the detected voltage signal; a signal level detecting step of detecting a transmitting signal level containing noises from the input signal; a signal level holding step of holding the transmitting signal level; a comparing step of comparing the transmitting signal level held at present execution of the gain control with the transmitting signal level held at preceding execution of the gain control; and a control signal outputting step of outputting the control signal to the gain variable amplifying means based on the detected voltage signal held at preceding execution of the gain control when the present control signal for a gain variable amplifier is lower in level than the preceding control signal for the gain variable amplifier and also the present transmitting signal level is reduced below the preceding transmitting signal level.

In order to attain the above object, the automatic gain control apparatus according to the second aspect of the present invention comprises a gain variable amplifying means which variably amplify an input signal in response to a control signal; an output signal detecting means which detects an output signal amplified by the gain variable amplifying means; a control signal generating means which generates the control signal for the gain variable amplifying means based on a detected output signal; a gain control state storing means which stores the gain control state every time when gain control of the gain variable amplifying means is executed; an input signal level detecting means which detects a signal level from the input signal; a comparing means which compares the signal level with the control state set value which is defined previously; and a controlling means which controls the gain of the gain variable amplifier means by the control signal corresponding to the control state stored at preceding execution of the gain control when the signal level is reduced below the control state set value.

Preferably, the automatic gain control device according to the second aspect of the present invention which achieves a constant output signal by controlling a gain variable amplifying means according to a control signal which is generated based on a level of an output signal which is derived by variably amplifying an input signal, is characterized by comprising a detecting means which detects an amplified output signal; a control signal generating means which generates the control signal for the gain variable amplifying means based on a detected voltage signal obtained by the detecting means; a control signal storing means which stores the control signal every time when gain control of the gain variable amplifying means is executed; a signal level detecting means which detects a transmitting signal level containing noises from the input signal; a comparing means which compares the transmitting signal level with a threshold value which is defined previously; and a control signal outputting means which outputs the control signal stored at preceding execution of the gain control to the gain variable amplifying means when the transmitting signal level is reduced below the threshold value.

Also, the automatic gain control device according to the second aspect of the present invention which achieves a constant output signal by controlling a gain variable amplifying means according to a control signal which is generated based on a level of an output signal which is derived by variably amplifying an input signal, is characterized by comprising a detecting means which detects an amplified output signal; a control signal generating means which generates the control signal for the gain variable amplifying means based on a detected voltage signal obtained by the detecting means; a control signal holding means which holds the control signal; a signal level detecting means which detects a transmitting signal level containing noises from the input signal; a signal level holding means which holds the transmitting signal level; a comparing means which compares the transmitting signal level held at present execution of the gain control with the transmitting signal level held by the signal level holding means at preceding execution of the gain control; and a control signal outputting means which outputs the control signal held by the control signal holding means at preceding execution of the gain control to the gain variable amplifying means when the present control signal for a gain variable amplifier is lower in level than the preceding control signal for the gain variable amplifier and the present transmitting signal level is reduced below the preceding transmitting signal level.

Also, the automatic gain control device according to the second aspect of the present invention which achieves a constant output signal by controlling a gain variable amplifying means according to a control signal which is generated based on a level of an output signal which is derived by variably amplifying an input signal, is characterized by comprising a detecting means which detects an amplified output signal; a control signal generating means which generates the control signal for the gain variable amplifying means based on a detected voltage signal obtained by the detecting means; a detected voltage signal holding means which holds the detected voltage signal; a signal level detecting means which detects a transmitting signal level containing noises from the input signal; a signal level holding means which holds the transmitting signal level; a comparing means which compares the transmitting signal level held at present execution of the gain control with the transmitting signal level held by the signal level holding means at preceding execution of the gain control; and a control signal outputting means which outputs the control signal to the gain variable amplifying means based on the detected voltage signal held by the detected voltage signal holding means at preceding execution of the gain control when the present control signal for a gain variable amplifier is lower in level than the preceding control signal for the gain variable amplifier and also the present transmitting signal level is reduced below the preceding transmitting signal level.

According to the present invention, it is provided a wireless communication device comprising a configuration of the automatic gain control device as mentioned above which is incorporated into a receiving system; and wherein automatic gain control for stabilizing an output signal associated with a receiving signal in the receiving system is carried out by the automatic gain control device.

DETAILED DESCRIPTION OF THE PREFERRED EMBODIMENTS

Figure 1:
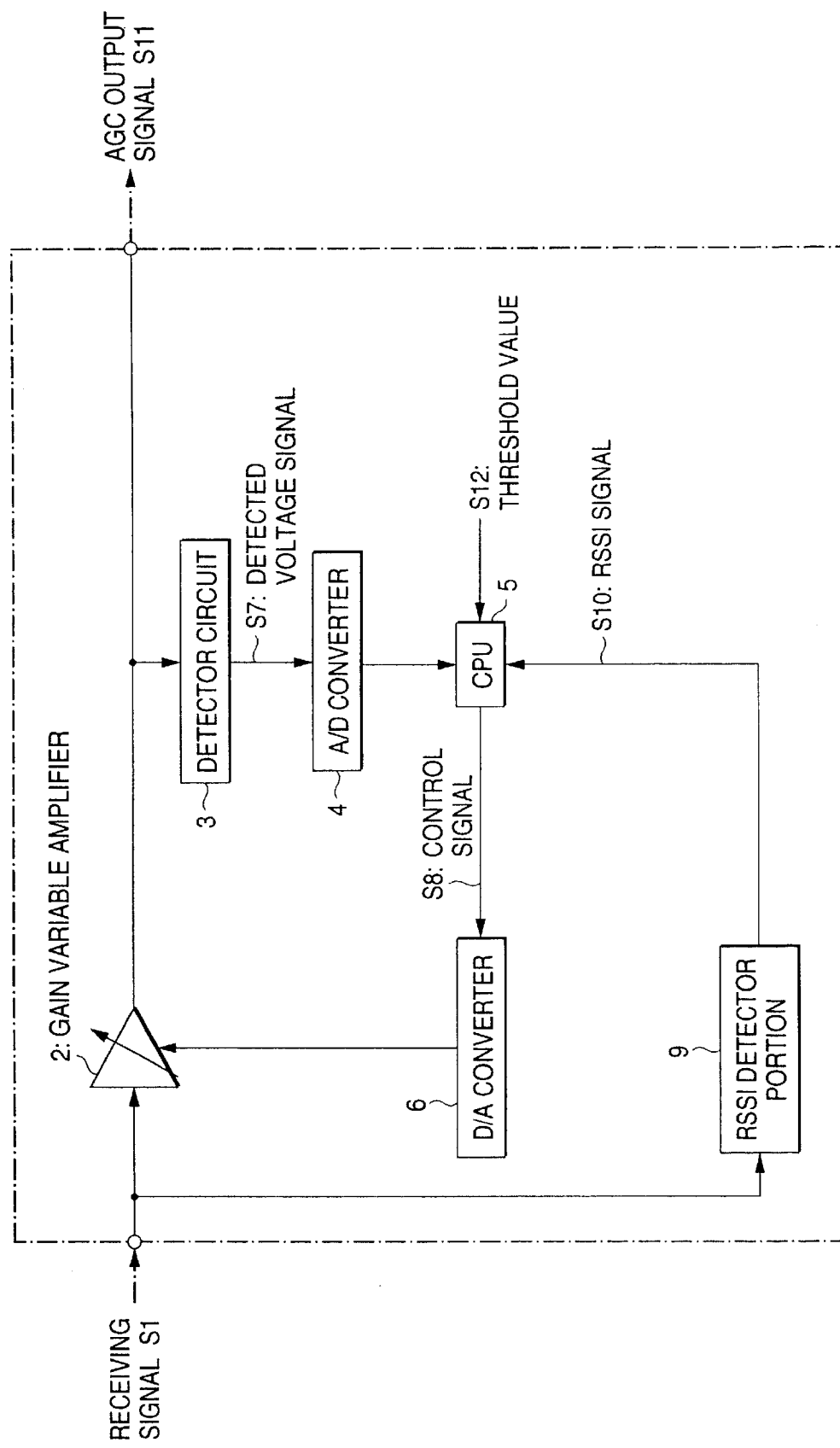
FIG. 1 is a block diagram showing an automatic gain control method and a configuration of a device for embodying the same according to a first embodiment of the present invention.

Embodiments will be described hereinafter. According to first embodiment, the control signal generating means, the comparing means, and the control signal outputting means are constructed by using the central processing unit (CPU). In addition, when the threshold value is set to the noise signal level and also the transmitting signal level in the input signal is equal to or smaller than the noise signal level, either the control signal obtained at the time of preceding execution of the gain control or the control signal obtained based on the detected voltage signal is output.

Such automatic gain control method and the device for embodying the same according to the present invention generates the control signal for the gain variable amplifying means in accordance with the detected voltage signal which is obtained by detecting the amplified output signal. At this time, the control signal is stored at the time of each execution of the gain control. Also, the transmitting signal level containing the noises is detected from the input signal, and then the control signal stored at the time of preceding execution of the gain control is sent out to the gain variable amplifying means when the transmitting signal level is reduced below the previously defined threshold value.

According to the second embodiment, when the control signal for the gain variable amplifying means is generated based on the detected voltage signal obtained by detecting the amplified output signal, this control signal is held in the latch circuit, etc. and also the transmitting signal level containing noises in the input signal is detected, and then such transmitting signal level is held in the latch circuit, etc. Then, when the present control signal for the gain variable amplifier is lower than the preceding control signal for the gain variable amplifier and also the present transmitting signal level is reduced below the transmitting signal level latched at the time of preceding execution of the gain control, the control signal held at the time of preceding execution of the gain control is sent out to the gain variable amplifying means.

According to the third embodiment, when the control signal for the gain variable amplifying means is generated based on the detected voltage signal obtained by detecting the amplified output signal, the detected voltage signal is held in the latch circuit, etc. and also the transmitting signal level containing the noises in the input signal is detected, and then this transmitting signal level is held in the latch circuit, etc. Then, when the present control signal for the gain variable amplifier is lower than the preceding control signal for the gain variable amplifier and also the present transmitting signal level is reduced below the transmitting signal level obtained at the preceding execution of the gain control, the control signal is sent out to the gain variable amplifying means based on the detected voltage signal held at the time of preceding execution of the gain control.

According to the present invention, even when the S/N of the input signal is degraded and the transmitting signal level is reduced below the noise signal level, it is possible not to reduce the control voltage of the gain variable amplifying means, so that the proper automatic gain control can always be achieved and thus good receiving characteristics can be assured. Furthermore, if reduction in level of the input signal is decided with the use of the transmitting signal level obtained at the time of previous execution of the gain control, procedures of setting and adjusting the threshold value can be omitted.

In addition, according to the radio communication device of the present invention, the configuration of the above automatic gain control device can be incorporated into a receiving system of the radio communication device to execute the automatic gain control for stabilizing the output signal of a demodulating means which example. As a result, if this configuration is provided into a receiving system of the automobile telephone, etc., for example, reduction in the control voltage of the gain variable amplifying means can be prevented even when the S/N of the input receiving signal is degraded and the transmitting signal level is reduced below the noise signal level, so that the proper automatic gain control can always be achieved. In this case, even when, because of deterioration of the communication surroundings, the signal level of the received signal is reduced or the noise signal level is increased, the preferable automatic gain control can be achieved, thus the good receiving characteristics can be assured, and thus demodulation error can be reduced.

The embodiments of the present invention will be explained in detail with reference to the accompanying drawings hereinafter.

First Embodiment

FIG. 1 is a block diagram showing an automatic gain control method and a configuration of a device for embodying the same according to a first embodiment of the present invention. In this disclosure, an example of a configuration of a digital automatic gain control device for executing the control in a digital fashion will be given hereunder.

The digital automatic gain control device is provided in a receiving system of a radio communication device such as the mobile telephone, the portable telephone, etc. Such digital automatic gain control device comprises a gain variable amplifier 2 for amplifying variably a receiving signal S1 (input signal) based on a control signal S8 via the automatic gain control (AGC), then stabilizing a level of the signal, and then outputting the stabilized signal as an AGC output signal S11, and a detector circuit 3 serving as a detecting means which detects a level of the AGC output signal S11 output from the gain variable amplifier 2 to then output a detected voltage signal S7.

In addition, the digital automatic gain control device also comprises an A/D converter 4 for converting the detected voltage signal S7 supplied from the detector circuit 3 into a digital signal, a CPU 5 for generating the control signal S8 based on the detected voltage signal S7 supplied from the A/D converter 4 as a digital signal and then outputting it, a D/A converter 6 for converting the control signal S8 supplied from the CPU 5 into an analogue signal, and an RSSI detector portion 9 serving as a signal level detecting means which detects a received signal strength indicator (RSSI) signal S10 corresponding to the transmission signal level from the receiving signal S1 and then outputting it to the CPU 5. The control signal S8 converted into the analogue signal is input into the gain variable amplifier 2 to carry out the automatic gain control. In the first embodiment, the CPU 5 is constructed to have respective functions of a control signal generating means, a control signal storing means, a comparing means, and a control signal outputting means.

Figure 2:
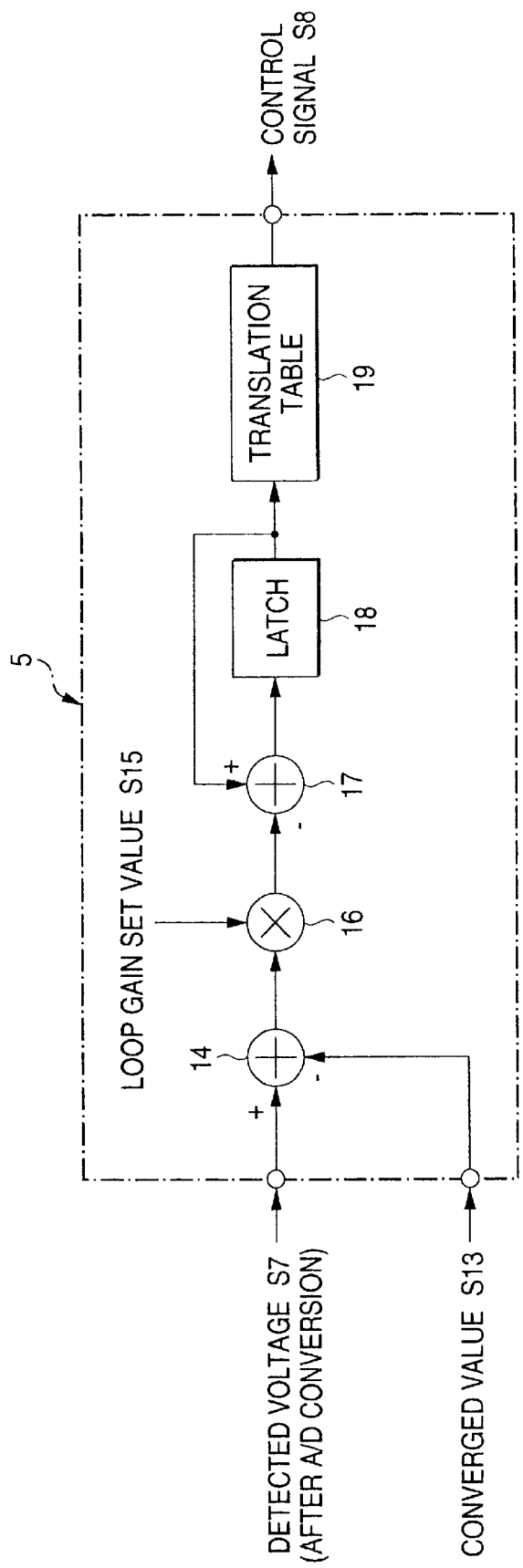
FIG. 2 is a block diagram showing a processing function associated with control signal generation by a CPU in FIG. 1.

FIG. 2 is a block diagram showing a processing function associated with control signal generation carried out by the CPU 5.

The CPU 5 comprises an adder portion 14 for calculating a difference between a detected voltage signal value S7 as a digital signal and a converged value S13, a variable multiplier portion 16 for multiplying a difference value as an output of the adder portion 14 and a predetermined loop gain set value S15 together, an adder portion 17 for calculating a difference between an output value of the variable multiplier portion 16 and a value being latched by a latch portion 18, a latch portion 18 for latching an output value of the adder portion 17, and a translation table 19 for translating calculated output values from the latch portion 18 to thus generate the control signal S8.

Figure 3:
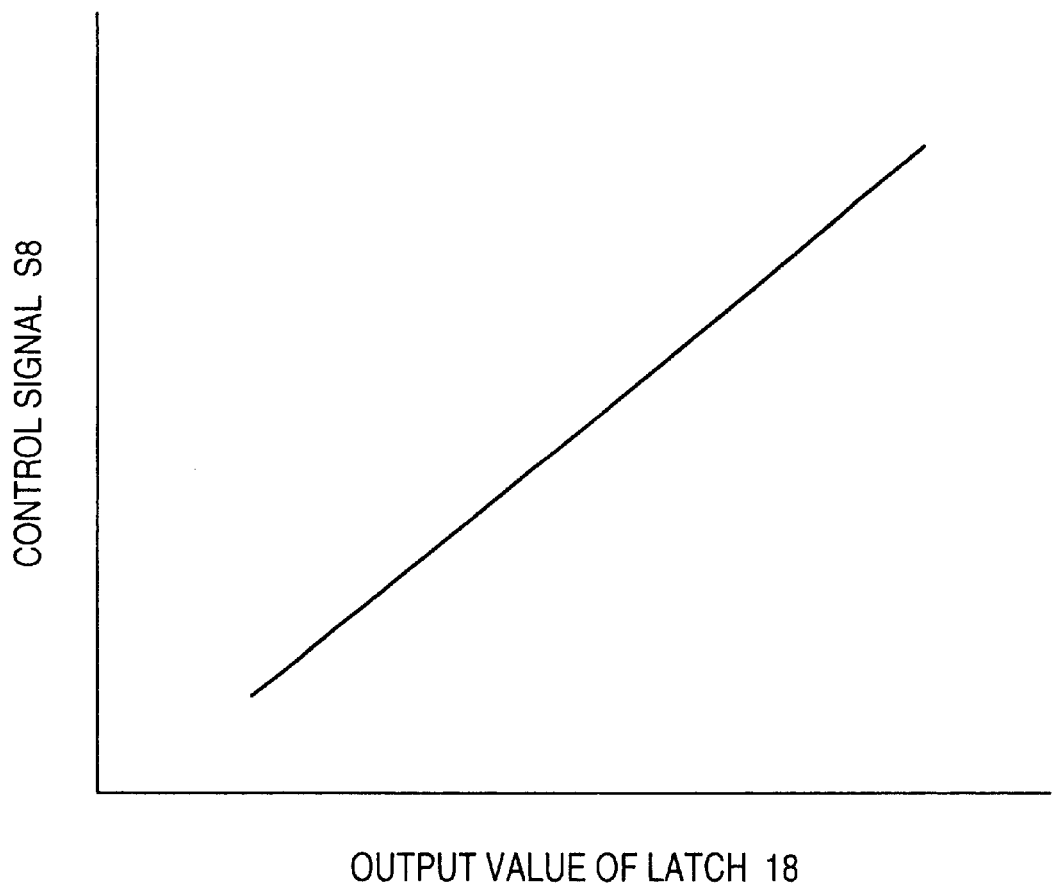
FIG. 3 is a view showing an example of contents of a translation table in FIG. 2.

FIG. 3 is a view showing an example of contents of the translation table 19.

The translation table 19 generates the control signal S8, which takes a temporally linearly increasing value in response to an output value of the latch portion 18, and then outputs it. This translation table 19 may be stored in a memory which is built in the CPU 5, for example. In this case, the translation table 19 may be stored in an extended memory. In such case, there are such an advantage that, if a detachable ROM, a programmable EEPROM, or the like is employed, the storing characteristic can be varied easily.

Next, an AGC operation in the first embodiment will be explained in the following.

The receiving signal S1 is input into the gain variable amplifier 2. If this device is applied to the mobile telephone or the radio paging device, the receiving signal S1 can be given as an intermediate frequency signal which has been subjected to the frequency conversion. While varying its gain based on the control signal S8 which is output from the CPU 5 and converted by the D/A converter 6, the gain variable amplifier 2 amplifies the receiving signal S1. The AGC output signal S11 which is obtained by amplifying the receiving signal S1 with the use of the gain variable amplifier 2 is detected in level by the detector circuit 3 (detecting step), and then the detected voltage signal S7 is converted into the digital signal by the A/D converter 4. The CPU 5 generates the control signal S8 based on the detected voltage signal S7 derived as the digital signal (control signal generating step).

At this time, as shown in FIG. 2, the CPU 5 causes the adder portion 14 to calculate a difference between the detected voltage signal value S7 as the digital signal and the converged value S13 via the adding process. Then, this difference value output from the adder portion 14 and the loop gain set value S15 which is appropriately set are variably multiplied by the variable multiplier portion 16. Then, the adder portion 17 calculates a difference value between a preceding value being latched by the latch portion 18 and a present value from the variable multiplier portion 16 via the adding process. This calculated value of the adder portion 17 is latched by the latch portion 18 and then input into the translation table 19. The control signal S8 is then generated with reference to the translation table 19. Here the translation table 19 outputs a value, which increases temporally linearly (increases linearly and monotonously) relative to the output value from the latch portion 18, as the corresponding control signal S8. According to above processes of the CPU 5, the control signal S8 corresponding to the difference value between the detected voltage signal value S7 as the digital signal and the converged value S13 can be obtained.

Then, the control signal S8 generated by the CPU 5 is converted into an analogue signal by the D/A converter 6, and then sent out to a control voltage input terminal of the gain variable amplifier 2 to execute the gain control. The detected voltage signal value S7 as the digital signal can be converged into the converged value S13 by repeating the above AGC loop operation to thus result in the difference value of 0. Thus, the control signal S8 can be kept constant and the AGC output signal S11 can be maintained at a constant signal level. At this time, the CPU 5 stores the control signal S8 cyclically in an internal or external memory (not shown) every step in which the gain control is executed (at the time of execution of the gain control) (control signal storing step).

At the same time, the RSSI detector portion 9 detects the RSSI signal S10 corresponding to a transmission signal level from the receiving signal S1 (signal level detecting step), and then outputs it to the CPU 5. The CPU 5 compares the RSSI signal S10 with the predetermined threshold value S12 (comparing step), and then outputs the control signal S8 to be fixed to a stored value of the control signal at the time of previous execution of the gain control (control signal outputting step) if a value of the RSSI signal S10 is less than the threshold value S12. Then, the control signal S8 stored at the time of previous execution of the gain control is converted into the analogue signal by the D/A converter 6, and then input into the gain variable amplifier 2 to execute the gain control. In this case, the threshold value S12 is set to the noise signal level, for example, such that, when the value of the RSSI signal S10 is less than the threshold value S12 in the above comparison, it is possible to detect the situation that the weak received electric field strength at which the noises are dominant over the detected voltage signal S7 is caused and thus the detected voltage signal S7 cannot be appropriately detected.

In the first embodiment, in the above automatic gain control, when the S/N of the receiving signal S1 is degraded and thus, for example, the noise signal level becomes equal to or larger than the transmitting signal level in the receiving signal S1, the value of the RSSI signal S10 detected by the RSSI detector portion 9 is below the threshold value S12 set previously by the CPU 5. When the CPU 5 detects that the RSSI signal S10 becomes less than the threshold value S12, it fixes the control signal S8 to the preceding value of the control signal stored at the time of execution of the gain control and then outputs it to control the gain variable amplifier 2 based on the preceding control signal S8. That is, the AGC loop operation is fixed by the preceding control signal S8. After this, if the value of the RSSI signal S10 exceeds the threshold value S12, the CPU 5 controls the gain variable amplifier 2 based on the present control signal S8. That is, the automatic gain control of the CPU 5 returns to the normal AGC loop operation.

In this manner, in this first embodiment, the transmission signal level in the receiving signal S1 is always monitored based on the RSSI signal S10. Thus, when the S/N of the receiving signal S1 is degraded and also the transmitting signal level is reduced below the noise signal level, reduction in the control voltage of the gain variable amplifier 2 can be suppressed by fixing the control signal to the preceding control signal S8. As a result, it is feasible to execute the proper automatic gain control and thus good receiving characteristics can be assured.

Second Embodiment

Figure 4:
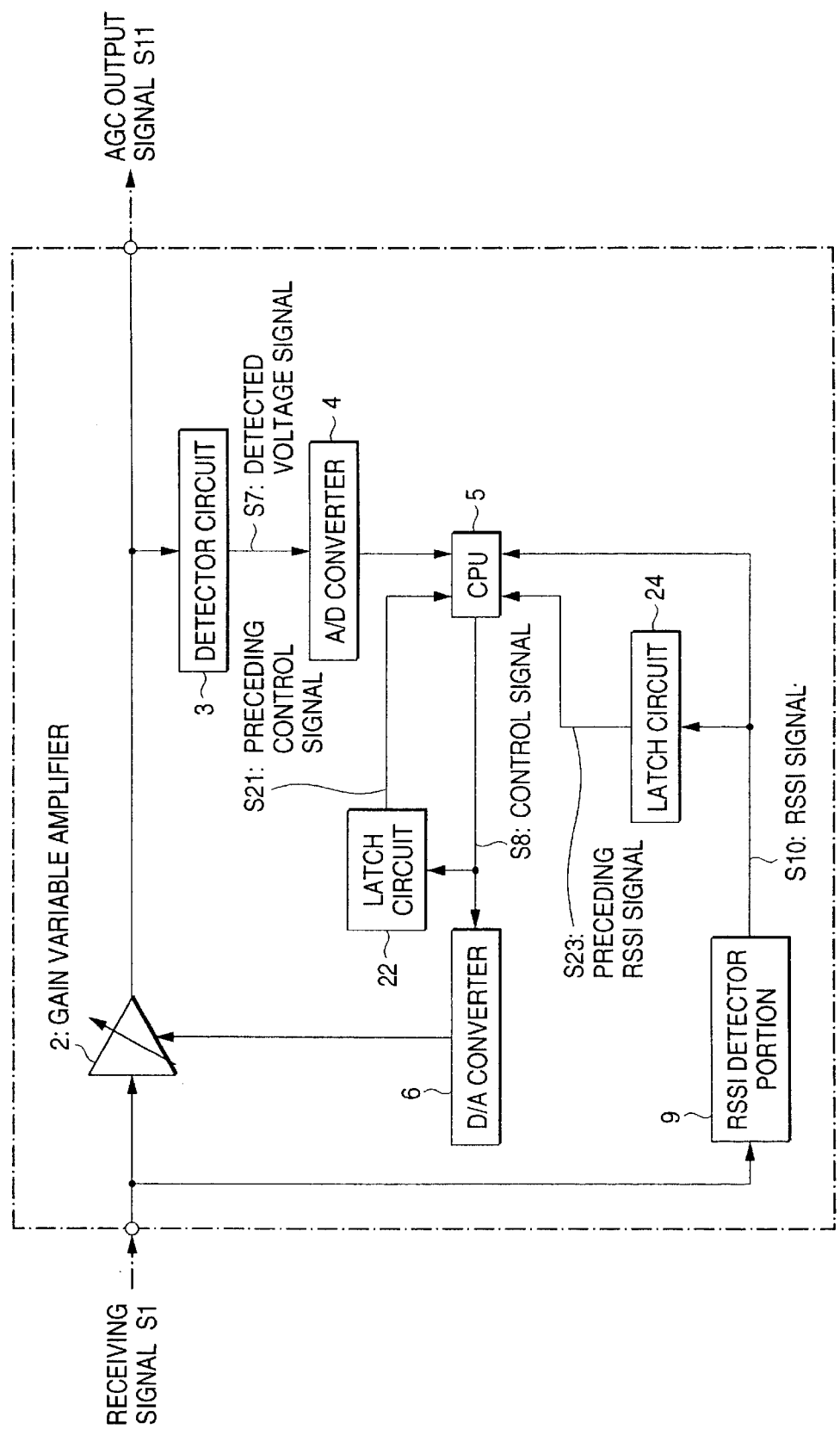
FIG. 4 is a block diagram showing a configuration according to a second embodiment of the present invention.

FIG. 4 is a block diagram showing a configuration according to a second embodiment of the present invention.

Like the above first embodiment, a digital automatic gain control device according to this second embodiment comprises the gain variable amplifier 2, the detector circuit 3, the A/D converter 4, the CPU 5, the D/A converter 6, and the RSSI detector portion 9. In addition, the second embodiment comprises a latch circuit 22 which corresponds to a control signal holding means which latches the control signal S8 generated by the CPU 5 and then outputting it as a preceding control signal S21 serving as the control signal stored at the time of preceding execution of the gain control, and a latch circuit 24 which corresponds to a signal level holding means which latches the RSSI signal S10 detected by the RSSI detector portion 9 and then outputting it as a preceding RSSI signal S23 which is the RSSI signal stored at the time of preceding execution of the gain control. In this case, both the processing functions associated with the control signal generation of the CPU 5 and the contents of the translation table 19 are similar to those shown in FIGS. 2 and 3 in the first embodiment. In the second embodiment, the CPU 5 is constructed to have respective functions of the control signal generating means, the comparing means, and the control signal outputting means.

Next, an AGC operation in the second embodiment will be explained hereunder.

The receiving signal S1 is input into the gain variable amplifier 2. While varying its gain based on the control signal S8 which is output from the CPU 5 and then converted into the analogue signal by the D/A converter 6, the gain variable amplifier 2 amplifies the receiving signal S1. The level of the AGC output signal S11 which is obtained by amplifying the receiving signal S1 with the use of the gain variable amplifier 2 is detected by the detector circuit 3 (detecting step). Then, the detected voltage signal S7 is converted into the digital signal by the A/D converter 4. As in the first embodiment, the CPU 5 also generates the control signal S8 based on the detected voltage signal S7 as the digital signal (control signal generating step).

Then, the control signal S8 generated by the CPU 5 is converted into the analogue signal by the D/A converter 6, and then sent out to the control voltage input terminal of the gain variable amplifier 2 to execute the gain control. The detected voltage signal value S7 as the digital signal can be converged into the converged value S13 by repeating the above AGC loop operation to thus result in the difference value of 0. Thus, the control signal S8 can be kept constant and the AGC output signal S11 can be maintained at a constant signal level. At this time, the control signal S8 is latched by the latch circuit 22 (control signal holding step), and then the preceding control signal S21 latched at the time of preceding execution of the gain control is output to the CPU 5.

At the same time, the RSSI detector portion 9 detects the RSSI signal S10 corresponding to the transmission signal level from the receiving signal S1 (signal level detecting step), and then outputs it to the CPU 5. At this time, the RSSI signal S10 is latched by the latch circuit 24 (signal level holding step), and then the preceding RSSI signal S23 latched at the time of preceding execution of the gain control is output to the CPU 5.

The CPU 5 compares the generated control signal S8 with the preceding control signal S21 latched in the latch circuit 22. Then, if a value of the present control signal S8 is smaller than a value of the preceding control signal S21 latched at the time of previous execution of the gain control, the CPU 5 further compares the RSSI signal S10 detected by the RSSI detector portion 9 with the preceding RSSI signal S23 latched by the latch circuit 24 (comparing step). In this comparison, if a value of the present RSSI signal S10 is smaller than a value of the preceding RSSI signal S23 latched at the time of previous execution of the gain control, the CPU 5 outputs the preceding control signal S21 latched in the latch circuit 22 as the control signal (control signal outputting step). Then, the preceding control signal S21 stored at the time of previous execution of the gain control is converted into the analogue signal by the D/A converter 6, and then input into the gain variable amplifier 2 to execute the gain control.

In the second embodiment, in the above automatic gain control, when the S/N of the receiving signal S1 is degraded and thus, for example, the noise signal level is equal to or larger than the transmitting signal level in the receiving signal S1, the value of the RSSI signal S10 detected by the RSSI detector portion 9 is reduced smaller than the value of the preceding RSSI signal S23 latched by the latch circuit 24 at the time of previous execution of the gain control. When the CPU 5 detects that the RSSI signal S10 becomes smaller than the preceding RSSI signal S23, it switches the control signal into the value to the preceding control signal S21 stored at the time of previous execution of the gain control, and then outputs it without output of the present control signal S8 to control the gain variable amplifier 2 based on the preceding control signal S21. That is, the AGC loop operation is fixed by the preceding control signal S21 obtained at the time of previous execution of the gain control. After this, if the value of the RSSI signal S10 exceeds the value of the preceding RSSI signal S23, the CPU 5 controls the gain variable amplifier 2 based on the present control signal S8. That is, the automatic gain control of the CPU 5 returns to the normal AGC loop operation.

In this way, in this second embodiment, the transmission signal level in the receiving signal S1 is always monitored based on the RSSI signal S10. Thus, when the S/N of the receiving signal S1 is degraded and also the value of the RSSI signal S10 is reduced below the value of the preceding RSSI signal S23, reduction in the control voltage of the gain variable amplifier 2 can be suppressed by employing the preceding control signal S21 at the time of previous execution of the gain control. As a result, like the first embodiment, the second embodiment makes it possible to execute the proper automatic gain control and thus to assure the good receiving characteristics. In the case of the second embodiment, setting and adjustment of the threshold value S12 required in the first embodiment can be omitted, and also the control process for maintaining the control signal to exceed a predetermined level in the automatic gain control can be implemented easily in the weak received electric field strength.

Third Embodiment

Figure 5:
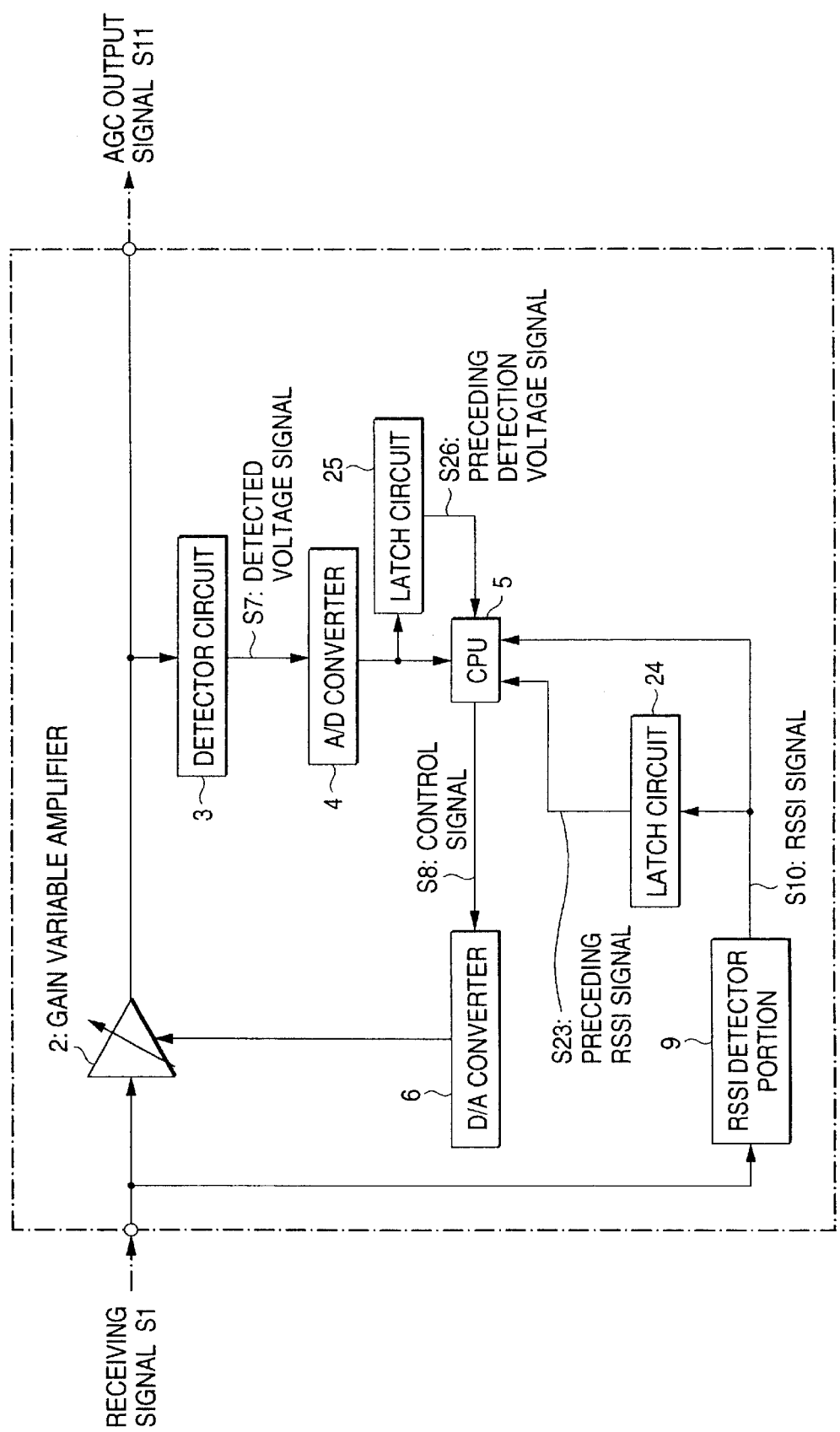
FIG. 5 is a block diagram showing a configuration according to a third embodiment of the present invention.

FIG. 5 is a block diagram showing a configuration according to a third embodiment of the present invention.

Like the foregoing first embodiment, a digital automatic gain control device according to this third embodiment comprises the gain variable amplifier 2, the detector circuit 3, the A/D converter 4, the CPU 5, the D/A converter 6, and the RSSI detector portion 9. In addition, the third embodiment comprises a latch circuit 25 which corresponds to a detected voltage holding means which latches the detected voltage signal S7 generated by the detector circuit 3 as the digital signal and then outputting it as a preceding detected voltage signal S26 serving as the detected voltage signal stored at the time of preceding execution of the gain control, and the latch circuit 24, as employed in the second embodiment, for latching the RSSI signal S10 detected by the RSSI detector portion 9 and then outputting it as the preceding RSSI signal S23 which is the RSSI signal stored at the time of preceding execution of the gain control. In this case, both the processing functions associated with the control signal generation of the CPU 5 and the contents of the translation table 19 are similar to those shown in FIGS. 2 and 3 in the first embodiment. In the third embodiment, the CPU 5 is constructed to have respective functions of the control signal generating means, the comparing means, and the control signal outputting means.

Next, an AGC operation in the third embodiment will be explained hereunder.

The receiving signal S1 is input into the gain variable amplifier 2. While varying its gain based on the control signal S8 which is output from the CPU 5 and then converted into the analogue signal by the D/A converter 6, the gain variable amplifier 2 amplifies the receiving signal S1. The AGC output signal S11 which is obtained by amplifying the receiving signal S1 with the use of the gain variable amplifier 2 is level-detected by the detector circuit 3 (detecting step). Then, the detected voltage signal S7 is converted into the digital signal by the A/D converter 4. The CPU 5 also generates the control signal S8 based on the detected voltage signal S7 as the digital signal, like the first embodiment (control signal generating step).

Then, the control signal S8 generated by the CPU 5 is converted into the analogue signal by the D/A converter 6, and then sent out to the control voltage input terminal of the gain variable amplifier 2 to execute the gain control. The detected voltage signal value S7 as the digital signal can be converged into the converged value S13 by repeating the above AGC loop operation to thus result in the difference value of 0. Therefore, the control signal S8 can be kept constant and thus the AGC output signal S11 can be maintained at a constant signal level. At this time, the detected voltage signal S7 as the digital signal is latched by the latch circuit 25 (detected voltage signal holding step), and then the preceding detected voltage signal S26 latched at the time of preceding execution of the gain control is output to the CPU 5.

At the same time, the RSSI detector portion 9 detects the RSSI signal S10 corresponding to the transmission signal level from the receiving signal S1 (signal level detecting step), and then outputs it to the CPU 5. At this time, the RSSI signal S10 is latched by the latch circuit 24 (signal level holding step), and then the preceding RSSI signal S23 latched at the time of preceding execution of the gain control is output to the CPU 5.

The CPU 5 compares the detected voltage signal S7 supplied from the detector circuit 3 with the preceding detected voltage signal S26 latched in the latch circuit 25. Then, if a value of the present detected voltage signal S7 is larger than a value of the preceding detected voltage signal S26 stored at the time of previous execution of the gain control, the CPU 5 generates the control signal S8 by using the detected voltage signal S7, then the D/A converter 6 converts it into the analogue signal and sends out it to the gain variable amplifier 2 to carry out the gain control.

On the contrary, if the value of the present detected voltage signal S7 is smaller than the value of the preceding detected voltage signal S26 stored at the time of preceding execution of the gain control, the CPU 5 further compares the RSSI signal S10 detected by the RSSI detector portion 9 with the preceding RSSI signal S23 latched by the latch circuit 24 (comparing step). In this comparison, if the value of the present RSSI signal S10 is smaller than the value of the preceding RSSI signal S23 latched at the time of previous execution of the gain control, the CPU 5 receives the preceding detected voltage signal S26 latched in the latch circuit 25, then generates the control signal S8 by using this signal, and then outputs it (control signal outputting step). Then, this control signal S8 is converted into the analogue signal by the D/A converter 6, and then input into the gain variable amplifier 2 to execute the gain control.

In the third embodiment, in the above automatic gain control, when the S/N of the receiving signal S1 is degraded and thus, for example, the noise signal level becomes equal to or larger than the transmitting signal level in the receiving signal S1, the value of the RSSI signal S10 detected by the RSSI detector portion 9 is reduced below the value of the preceding RSSI signal S23 latched by the latch circuit 24 at the time of previous execution of the gain control. When the CPU 5 detects that the RSSI signal S10 becomes smaller than the preceding RSSI signal S23, it generates the control signal S8 by using the preceding detected voltage signal S26 stored at the time of previous execution of the gain control in place of the present detected voltage signal S7, and then controls the gain variable amplifier 2 based on the control signal S8. That is, the AGC loop operation is fixed by the control signal S8 which is obtained from the preceding detected voltage signal S26 stored at the time of previous execution of the gain control. After this, if the value of the RSSI signal S10 is increased larger than the value of the preceding RSSI signal S23, the CPU 5 controls the gain variable amplifier 2 based on the control signal S8 derived from the present detected voltage signal S7. That is, the automatic gain control of the CPU 5 returns to the normal AGC loop operation.

In this fashion, in this third embodiment, the transmission signal level in the receiving signal S1 is always monitored based on the RSSI signal S10. Thus, when the S/N of the receiving signal S1 is degraded and also the value of the RSSI signal S10 is reduced below the value of the preceding RSSI signal S23, reduction in the control voltage of the gain variable amplifier 2 can be suppressed by utilizing the control signal S8 derived from the preceding detected voltage signal S26 latched at the time of previous execution of the gain control. As a result, like the first embodiment, the third embodiment makes it possible to execute the proper automatic gain control and thus to assure the good receiving characteristics. In the case of the third embodiment, like the second embodiment, setting and adjustment of the threshold value S12 required in the first embodiment can be omitted, and also the control process for maintaining the control signal to exceed a predetermined level in the automatic gain control can be implemented easily in the weak received electric field strength.

As described above, according to the automatic gain control method and the device for embodying the same of the present invention, even when the S/N of the input signal is degraded and the transmitting signal level is reduced below the noise signal level, it is possible not to reduce the control voltage of the gain variable amplifying means, so that the proper automatic gain control can always be achieved and thus good receiving characteristics can be assured. Furthermore, if reduction in level of the input signal is decided with the use of the transmitting signal level obtained at the time of previous execution of the gain control, procedures of setting and adjusting the threshold value can be omitted.

In addition, according to the radio communication device of the present invention, since the configuration of the automatic gain control device can be incorporated into a receiving system of the radio communication device and thus the automatic gain control to stabilize the output signal of the received signal from the receiving system can be executed by the automatic gain control device, reduction in the control voltage of the gain variable amplifying means can be suppressed even when the S/N of the input signal is degraded, so that the proper automatic gain control can always be achieved. As a result, even when, because of deterioration of the communication surroundings, the signal level of the received signal is reduced or the noise signal level is increased, the preferable automatic gain control can be achieved and thus the good receiving characteristics can be assured.

What is claimed is:

1. An automatic gain control method of achieving a constant output signal by controlling a gain variable amplifying means according to a control signal which is generated based on a level of an output signal which is derived by variably amplifying an input signal, the method comprising the steps of:

a detecting step of detecting an amplified output signal;

a control signal generating step of generating the control signal for the gain variable amplifying means based on a detected voltage signal obtained by detection;

a control signal holding step of holding the control signal;

a signal level detecting step of detecting a transmitting signal level the input signal;

a signal level holding step of holding the transmitting signal level;

a comparing step of comparing the transmitting signal level held at present execution of the gain control with the transmitting signal level held at preceding execution of the gain control; and a control signal outputting step of outputting the control signal held at preceding execution of the gain control to the gain variable amplifying means when the present control signal for a gain variable amplifier is lower in level than the preceding control signal for the gain variable amplifier and also the present transmitting signal level is reduced below the preceding signal level.

2. An automatic gain control device for achieving a constant output signal by controlling a gain variable amplifying means according to a control signal which is generated based on a level of an output signal which is derived by variably amplifying an input signal, the device comprising:

a detecting means which detects an amplified output signal;

a control signal generating means which generates the control signal for the gain variable amplifying means based on a detected voltage signal obtained by the detecting means;

a control signal holding means which holds the control signal;

a signal level detecting means which detects a transmitting signal level from the input signal;

a signal level holding means which holds the transmitting signal level;

a comparing means which compares the transmitting signal level held at present execution of the gain control with the transmitting signal level held by the signal level holding means at preceding execution of the gain control; and a control signal outputting means which outputs the control signal held by the control signal holding means at preceding execution of the gain control to the gain variable amplifying means when the present control signal for a gain variable amplifier is lower in level than the preceding control signal for the gain variable amplifier and also the present transmitting signal level is reduced below the preceding transmitting signal level.

* * * * *